United States Patent
Borah et al.

(10) Patent No.: US 10,297,334 B2
(45) Date of Patent: May 21, 2019

(54) SINGLE CIRCUIT ONE-TIME PROGRAMMABLE MEMORY AND VOLATILE MEMORY

(71) Applicant: TEXAS INSTRUMENTS INCORPORATED, Dallas, TX (US)

(72) Inventors: Anindita Borah, Bangalore (IN); Muthusubramanian Venkateswaran, Bengaluru (IN); Kushal D. Murthy, Bangalore (IN); Vikram Gakhar, Bangalore (IN); Preetam Tadeparthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 2 days.

(21) Appl. No.: 15/597,820

(22) Filed: May 17, 2017

(65) Prior Publication Data
US 2017/0337985 A1 Nov. 23, 2017

(30) Foreign Application Priority Data
May 17, 2016 (IN) .............................. 201641016970

(51) Int. Cl.
| | | |
|---|---|---|
| G11C 29/00 | (2006.01) | |
| G11C 29/38 | (2006.01) | |
| G11C 29/36 | (2006.01) | |
| G11C 17/08 | (2006.01) | |
| G11C 17/16 | (2006.01) | |
| G11C 17/18 | (2006.01) | |

(52) U.S. Cl.
CPC .............. *G11C 29/38* (2013.01); *G11C 17/08* (2013.01); *G11C 17/16* (2013.01); *G11C 17/18* (2013.01); *G11C 29/36* (2013.01)

(58) Field of Classification Search
CPC ......... G11C 29/38; G11C 29/36; G11C 17/08; G11C 17/16; G11C 17/18
See application file for complete search history.

(56) References Cited

U.S. PATENT DOCUMENTS 8,842,482 B1 * 9/2014 Kunst ...................... G11C 7/04
365/185.04

* cited by examiner

*Primary Examiner* — Samir W Rizki
(74) *Attorney, Agent, or Firm* — Kenneth Liu; Charles A. Brill; Frank D. Cimino

(57) ABSTRACT

A one-time programmable (OTP) circuit. The OTP circuit includes a non-volatile OTP memory disposed on a first circuit die. The OTP memory includes a floating gate terminal. The OTP circuit also includes a cross-coupled latch disposed on the first circuit die and coupled to the OTP memory and volatile memory input circuitry disposed on the first circuit die and coupled to the cross-coupled latch. The volatile memory input circuitry is configured to receive a test value and write the test value into the cross-coupled latch. The OTP circuit is configured to receive a programming command and store the test value in the OTP memory in response to receipt of the programming command.

20 Claims, 4 Drawing Sheets

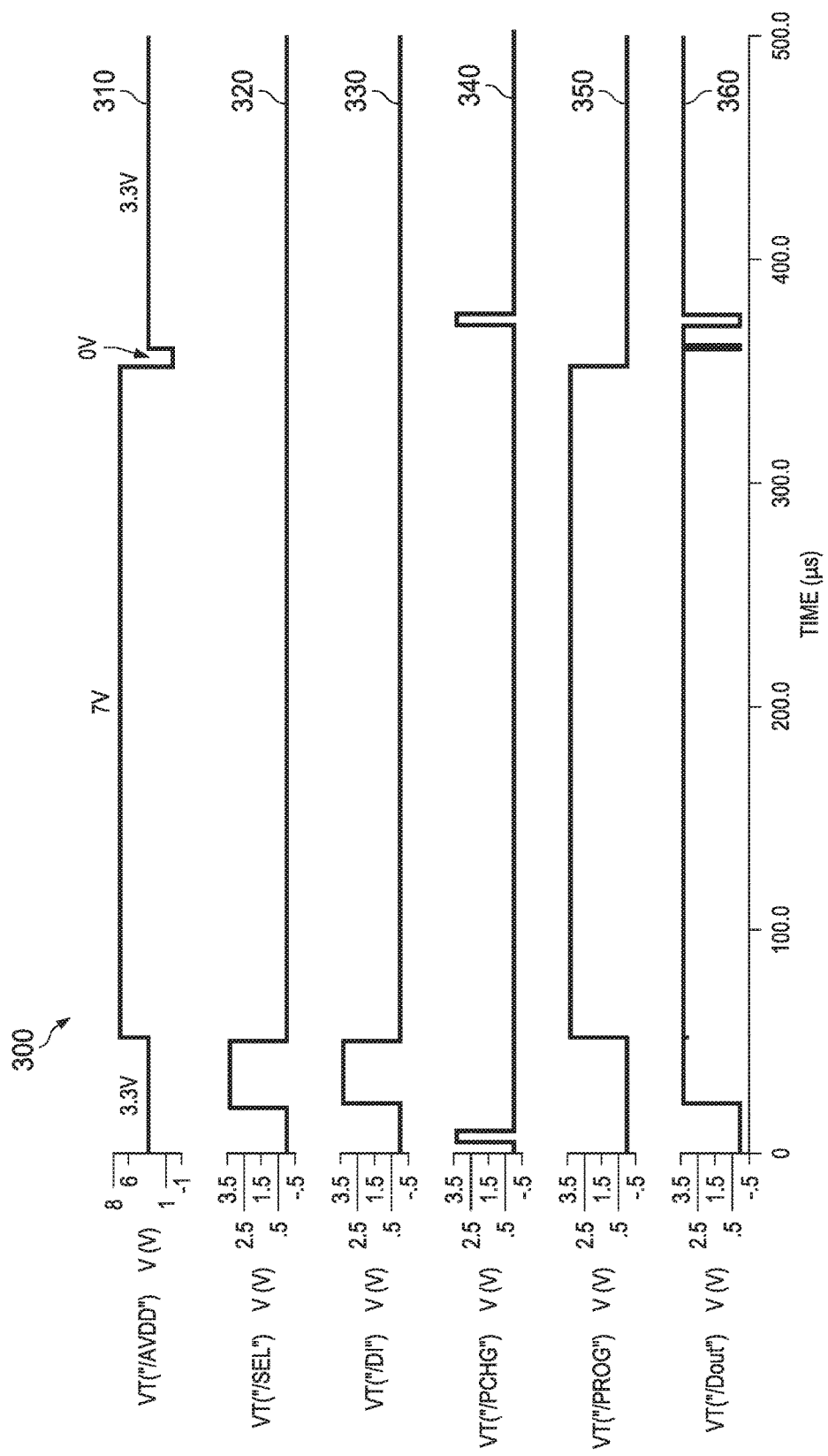

SINGLE CIRCUIT ONE-TIME PROGRAMMABLE MEMORY AND VOLATILE MEMORY

CROSS-REFERENCE TO RELATED APPLICATIONS

The present application claims priority to Indian Provisional Patent Application No. 201641016970, filed May 17, 2016, titled "IMPLEMENTATION OF A ONE-TIME PROGRAMMABLE MEMORY AND VOLATILE MEMORY IN A SINGLE LATCH CIRCUIT," which is incorporated herein by reference in its entirety.

BACKGROUND

One-time programmable (OTP) circuits are non-volatile circuits that after being programmed with data, store the data for later use even if the OTP circuits are reset or lose power. OTP circuits are used in a variety of implementation manners, including storing and providing trim or tuning values (or more generally, reference values) for fine tuning a response of a component coupled to the OTP circuit. After an OTP circuit is programmed, it may be unchangeable through electronic means, thus an OTP circuit programmed with an incorrect value may require replacement to program a correct value.

SUMMARY

In some embodiments, an OTP circuit includes a non-volatile OTP memory disposed on a first circuit die. The OTP memory may include a floating gate terminal and a cross-coupled latch disposed on the first circuit die and coupled to the OTP memory. A volatile memory volatile memory input circuitry also may be disposed on the first circuit die and coupled to the cross-coupled latch. The volatile memory volatile memory input circuitry is configured to receive a test value and write the test value into the cross-coupled latch. The OTP circuit is configured to receive a programming command and store the test value in the OTP memory in response to receipt of the programming command.

Other embodiments are directed to a test system. The test system may include an OTP circuit, a test circuit coupled to the OTP circuit, a measurement device coupled to the test circuit, and a controller coupled to the OTP circuit and the measurement device. The controller may be configured to transmit a test value to the OTP circuit for use in testing the test circuit, receive a measurement from the measurement device where the measurement indicates a response of the test circuit generated responsive to receipt of the test value from the OTP circuit, and program the OTP circuit with the test value responsive to receipt of the measurement from the measurement device.

In yet other embodiments, a method includes providing, by a controller, a test value to an OTP circuit and generating, by the OTP circuit, an output according to the test value using a volatile storage latch in response to receipt of a select signal instructing the OTP circuit to generate the output. The method also includes instructing, by the controller, the OTP circuit to burn the test value into a non-volatile OTP memory, and burning, by the OTP circuit, the test value into the OTP memory as a programmed value substantially equal to the test value.

BRIEF DESCRIPTION OF THE DRAWINGS

For a detailed description of various examples, reference will now be made to the accompanying drawings in which:

FIG. 3 shows a signal diagram of a second portion of the OTP circuit in accordance with various embodiments.

DETAILED DESCRIPTION

Disclosed are embodiments that provide at least for volatile testing of binary data and non-volatile storage of the binary data in an OTP circuit. The OTP circuit may be implemented, for example, on a single die and/or in a single electrical chip or package. The disclosed OTP circuit is operable, in at least some embodiments, as both a clearable latch and a non-clearable (e.g., by electrical techniques) OTP memory. The OTP circuit may be coupled to any one or more other components or devices for testing, for example, in a factory prior to delivery to a customer. The other components may be, for example, measurement equipment, voltage supplies, logic structures (e.g., digital logic structures, a field programmable gate array (FPGA), a processor, and the like) configured to interact with the OTP circuit to determine a desired value for non-volatile storage in the OTP circuit. Combining both the clearable latch and the OTP memory in a single OTP circuit, in some embodiments, results in reduced size (e.g., as measured in physical footprint or surface area of the OTP circuit) when compared to existing implementations of volatile testing of binary data and non-volatile storage of the binary data.

Figure 1:
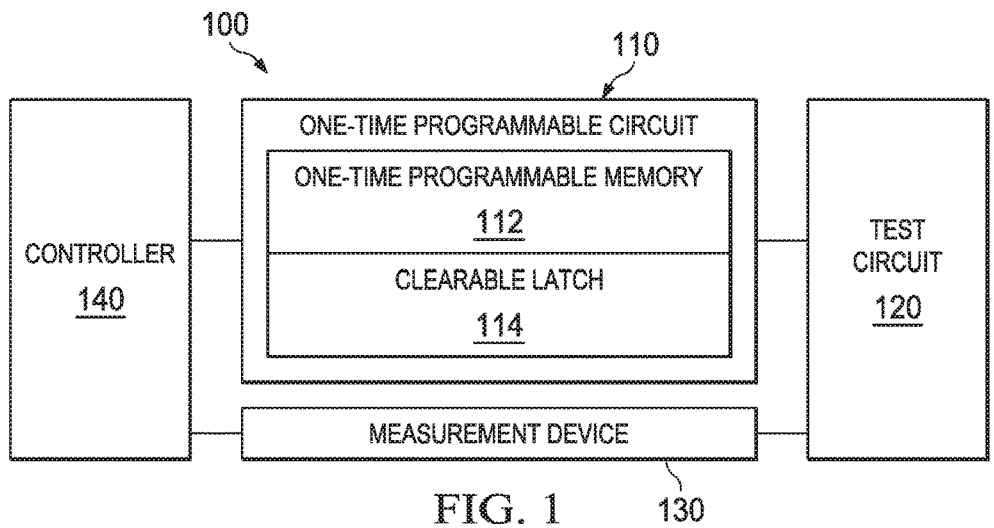
FIG. 1 shows a schematic diagram of a testing system including an OTP circuit according to various embodiments.

FIG. 1 is a schematic diagram of a testing system 100 including an OTP circuit according to various embodiments. The testing system 100 includes OTP circuit 110, test circuit 120, measurement device 130, and controller 140. The OTP circuit 110 is coupled to the test circuit 120 and configured to provide the test circuit 120 with a digital signal (e.g., comprising one or more bits). The OTP circuit 110 in this embodiment includes an OTP memory 112 (while illustrated as one OTP memory 112 in FIG. 1, it should be understood that the testing system 100 and/or the OTP circuit 110 may include more than one OTP memory 112) and a clearable latch 114 (in which case the OTP circuit 110 outputs a one-bit digital signal to the test circuit 120) or more than one OTP memory 112 and clearable latch 114 (in which case the OTP circuit 110 outputs a digital signal to the test circuit 120 having a same number of bits as the OTP circuit 110 has OTP memories 112). The test circuit 120 is, for example, a circuit which utilizes the digital signal received from the OTP circuit 110 at least partially in determining an operation and/or an output of the test circuit 120. For example, in some embodiments the test circuit 120 may be an amplifier configured to use the digital signal received from the OTP circuit 110 as a gain of the amplifier. In other embodiments, the test circuit may be a filter configured to use the digital signal received from the OTP circuit 110 as a tuning value for tuning a response of the filter.

To determine the digital signal output by the OTP circuit 110 to the test circuit 120, in some embodiments a plurality of possible digital signals are tested. For example, in one embodiment the controller 140 is coupled to the OTP circuit 110 and the measurement device 130, and the measurement device 130 is coupled to the test circuit 120. The controller 140 outputs a test value to the OTP circuit 110 along with a signal indicating the test value is to be tested with the test circuit 120 in a volatile manner (e.g., using a volatile memory such that the OTP circuit does not store the test value in a non-volatile memory). The OTP circuit 110 in turn outputs the test value as the digital signal to the test circuit 120. The measurement device 130 measures a response of the test circuit 120 to the digital signal received from the OTP circuit 110 and provides the measurement, either directly or indirectly, to the controller 140. The measurement device 130 may be a measurement device capable of measuring an electronic response or characteristic and providing the response to the controller 140, a scope of which is not limited herein.

In some embodiments, the controller 140, based on the measurement received from the measurement device 130, determines that the response of the test circuit 120 to the digital signal received from the OTP circuit 110 is not substantially similar to a desired response (e.g., not within a threshold range of the desired response) and may alter the test value output to the OTP circuit 110, at which time the above testing process repeats. In other embodiments, the controller 140, based on the measurement received from the measurement device 130, determines that the response of the test circuit 120 to the digital signal received from the OTP circuit 110 is substantially similar to the desired response and may instruct the OTP circuit 110 to store the test data in a non-volatile memory. Storing the test data in the non-volatile memory, in some embodiments, is referred to as burning the test data to the OTP circuit 110. After the test data is stored by the OTP circuit 110 in the non-volatile memory, the stored test data may be unchangeable in the OTP circuit by electrical mechanisms (though the stored test data may not be permanently unchangeable, for example, through the use of mechanical means).

When the controller 140 instructs the OTP circuit 110 to store the test data in the non-volatile memory, the controller 140 ceases transmitting the signal indicating the test value is to be tested with the test circuit 120 in a volatile manner and instead transmits a programming instruction to the OTP circuit 110. The controller 140, in some embodiments, also transmits an instruction to a power supply (not shown) to cause the power supply to provide the OTP circuit 110 with a voltage of a sufficient magnitude and for a sufficient period of time to burn the test data to the OTP circuit 110. When the OTP circuit 110 receives the programming signal from the controller 140, the OTP circuit 110 stores the test data in a non-volatile memory (provided that the OTP circuit 110 also receives the voltage of the sufficient magnitude and for the sufficient period of time to burn the test data to the OTP circuit 110). After the OTP circuit 110 stores the test data, the controller 140 may reset the OTP circuit 110 (e.g., by instructing the power supply to provide the OTP circuit 110 with no voltage) and/or precharging the OTP circuit 110 by outputting a precharge signal to the OTP circuit 110. Precharging the OTP circuit 110, in some embodiments, causes an output of the OTP circuit 110 to be zero for at least a duration of receipt of the precharge signal by the OTP circuit 110.

Figure 2A:
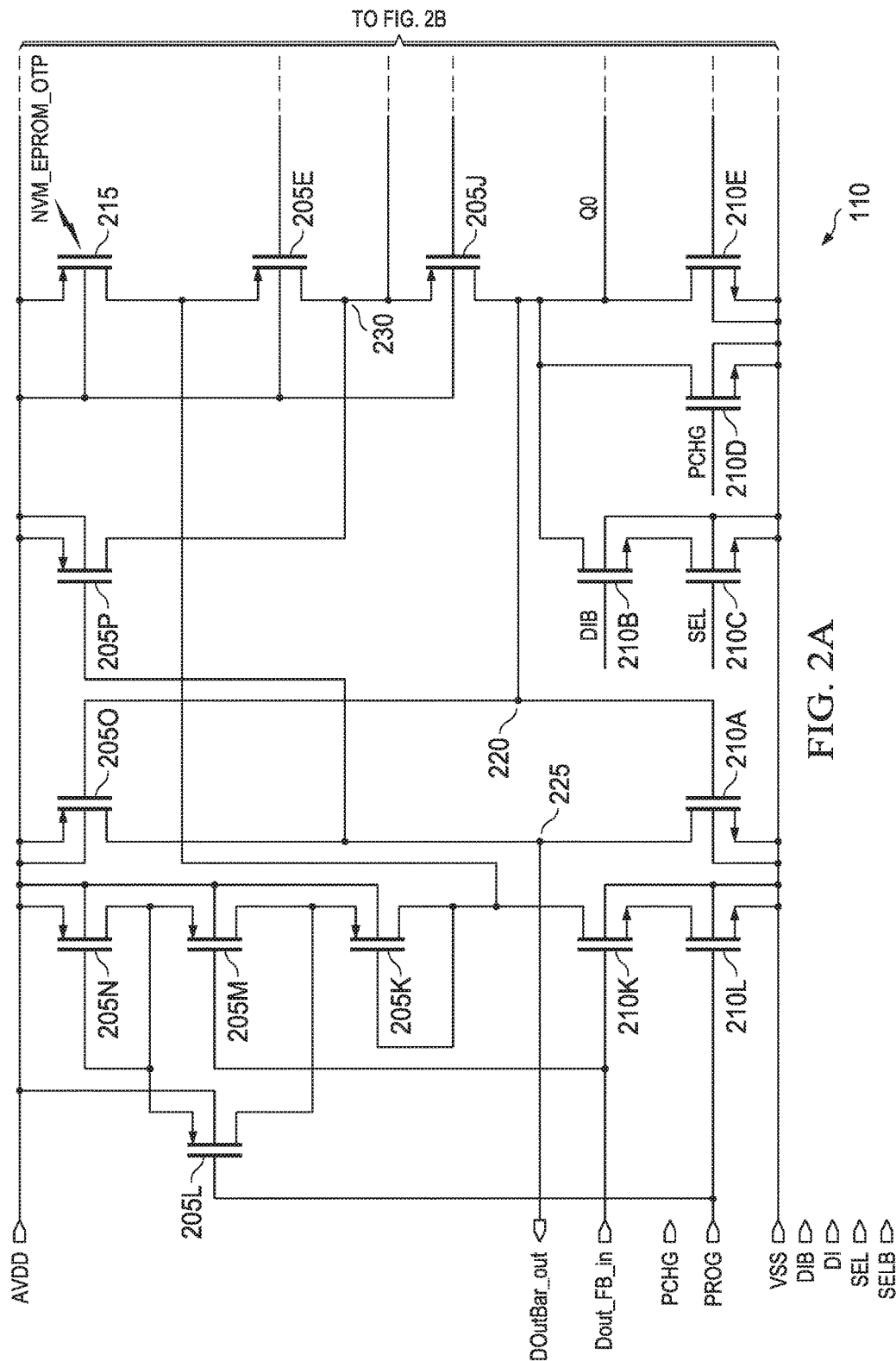
FIG. 2A shows a schematic diagram of the OTP circuit in accordance with various embodiments.
Figure 2B:
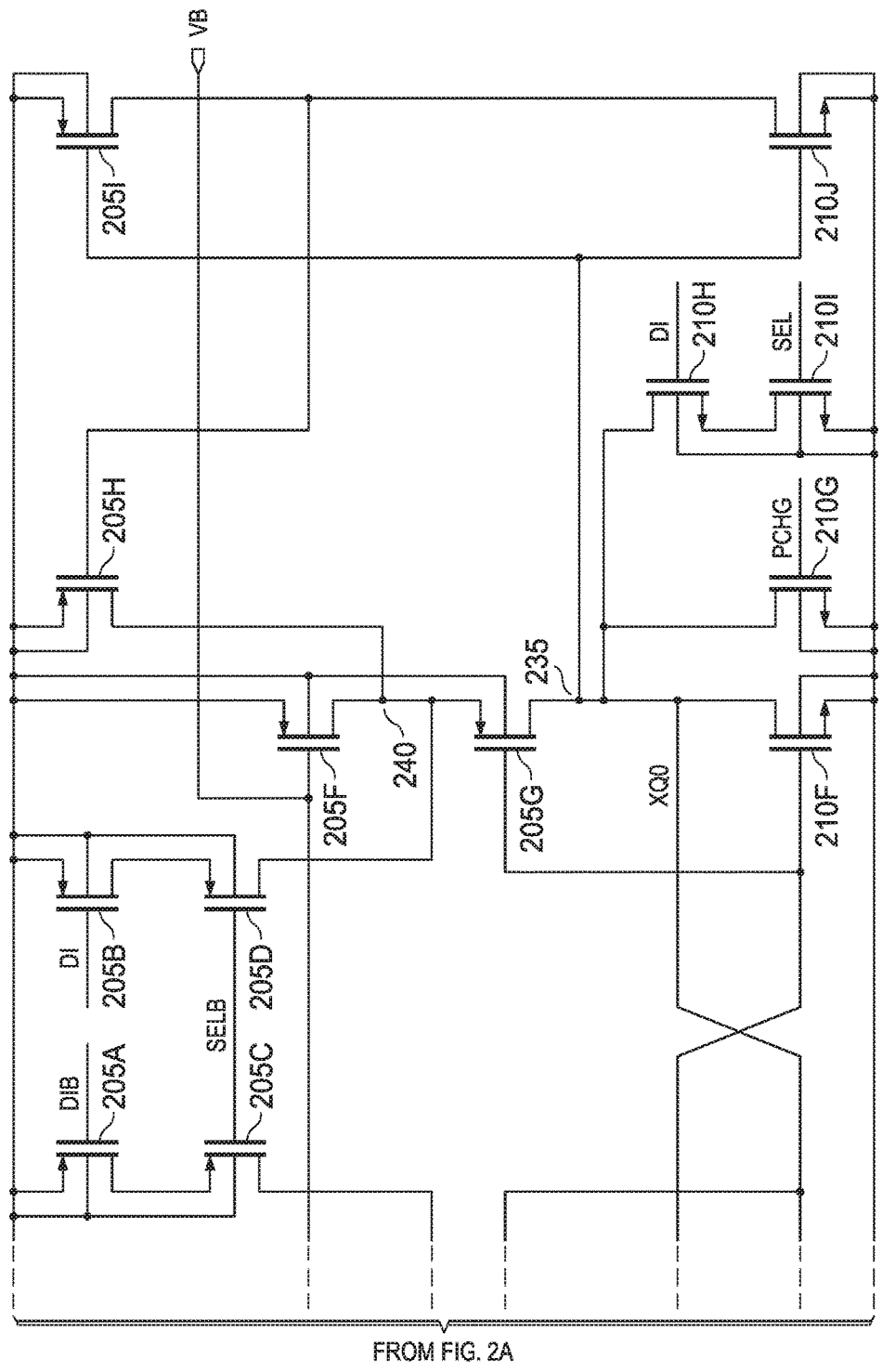
FIG. 2B shows a schematic diagram of a first portion of the OTP circuit in accordance with various embodiments.

FIGS. 2A and 2B are schematic diagrams of the OTP circuit 110 in accordance with various embodiments. It should be noted that FIGS. 2A and 2B form a single schematic diagram of the OTP circuit 100 and are illustrated as two figures for the sake of clarity. The OTP circuit 110 comprises a plurality of p-type metal oxide semiconductor (PMOS) transistors (noted individually as PMOS transistor 205$n$ and collectively as PMOS transistors 205A-205P), a plurality of n-type metal oxide semiconductor (NMOS) transistors (noted individually as NMOS transistor 210$n$ and collectively as NMOS transistors 210A-210L), and an OTP memory 215. Each of the PMOS transistors 205A-205P, the NMOS transistors 210A-210L, and the OTP memory 215 may comprise a gate terminal, a drain terminal, and a source terminal. Any one of the PMOS transistors 205A-205P, the NMOS transistors 210A-210L, and the OTP memory 215 may be controlled by any device or signal and may have its gate terminal coupled, directly or indirectly, to the device. Any one of the PMOS transistors 205A-205P, the NMOS transistors 210A-210L, and/or the OTP memory 215 said to be coupled between two points may be understood to have its drain terminal coupled to a first of the two points and its source terminal coupled to a second of the two points. Additionally, the PMOS transistors 205A-205P, the NMOS transistors 210A-210L, and the OTP memory 215 may be any suitable devices such as depletion mode transistors, enhancement mode transistors, and the like. In some embodiments, the PMOS transistors 205J and 205G and the NMOS transistors 210E and 210F may collectively be referred to as a cross-coupled latch or clearable latch (e.g., the clearable latch 114 of FIG. 1). In other embodiments, the cross-coupled latch may also include the PMOS transistors 205O, 205P, 205H, and 205I, as well as the NMOS transistors 210A and 210J. In some embodiments, the PMOS transistors 205A-205D and the NMOS transistors 210B, 210C, 210H, and 210I may collectively be referred to as a volatile memory. In other embodiments, the cross-coupled latch described above, along with the PMOS transistors 205A-205D and the NMOS transistors 210B, 210C, 210H, and 210I, may be referred to as the volatile memory or clearable latch (e.g., the clearable latch 114 of FIG. 1). In such embodiments, the PMOS transistors 205A-205D and the NMOS transistors 210B, 210C, 210H, and 210I may force the cross coupled latch (and thus the output of the OTP circuit 110) to a correct value and may be referred to as a volatile memory input or volatile memory input circuitry.

The OTP memory 215, in some embodiments, is a PMOS transistor having a floating gate (e.g., a gate terminal that is not coupled to another component). When a sufficiently high voltage is driven across the source and drain of the OTP memory 215, the OTP memory 215 may store a binary value of "1" in a non-volatile manner. For example, when the sufficiently high voltage is driven across the source and drain of the OTP memory 215, charge from within a channel of the OTP memory 215 may transfer to the floating gate of the OTP memory 215 and burn the OTP memory 215 with a binary "1". Such a transfer of charge and burning of the OTP memory 215 may cause the OTP memory 215 to substantially function as if a binary "1" is being asserted at its gate terminal at substantially all times, thereby resulting in a comparatively low impedance asserted by the OTP memory 215 between its source terminal and its drain terminal when compared to an impedance asserted by the OTP memory 215 between its source terminal and its drain terminal prior to burning of the OTP memory 215. The comparatively low impedance causes the OTP memory 215 to operate as a substantially short-circuit (minus some possible voltage drop across the OTP memory 215) between its source and drain terminals. For example, prior to burning the OTP memory, the impedance asserted by the OTP memory 215 between its source terminal and its drain terminal may, in some embodiments, be on an order of megaohms (or millions of ohms), whereas after burning of the OTP circuit the impedance is only a few ohms (e.g., in some embodiments, approximately 10 ohms or less). When the OTP memory 215 is not burned, the floating nature of the gate terminal of the OTP memory 215 causes the OTP memory 215 to substantially function as if a binary "0" is being asserted at its gate terminal, thereby causing the OTP memory to have the comparatively high impedance and operate as a substantially open circuit between its source and drain terminals.

As discussed above, prior to burning the OTP memory 215, it may be desirable to test various values to determine which binary value (e.g., "0" or "1") to store in a non-volatile memory in the OTP memory 215. To test the binary values, the OTP circuit 110 receives, from the controller 140, a test value as binary input, indicated in FIGS. 2A and 2B as DI. The OTP circuit 110 also receives a complement of the binary input (e.g., the binary input inverted by an inverter (not shown)), indicated in FIGS. 2A and 2B as DIB. The OTP circuit 110 also receives, from the controller 140, a select signal, indicated in FIGS. 2A and 2B as SEL and a complement of the select signal (e.g., the select signal inverted by an inverter (not shown)), indicated in FIGS. 2A and 2B as SELB.

When SEL is "1" and DI is "1", the OTP circuit 110 outputs DIB (e.g., "0") as the output of the OTP circuit 110. The output of the OTP circuit 110 is indicated in FIGS. 2A and 2B as DOutBar_out which may also be referred to as an inverted or complement output. The output of the OTP circuit 110 may be coupled to an inverter (not shown) that converts DOutBar_out to DOut (e.g., converts the inverted or complement output into a non-inverted output). In addition, the OTP circuit 110 receives a bias voltage signal (VB) configured to control operation of the PMOS transistors 205E and 205F. When SEL is "1", DI is "1" and VB is "0", PMOS transistors 205B, 205G, and 205H operate as substantially open circuits while PMOS transistors 205A, 205C, 205D, 205F, 205J, and 205P operate as substantially short circuits. Similarly, NMOS transistors 210C, 210F, 210H, and 210I operate as substantially short circuits and NMOS transistors 210B and 210E operate as substantially open circuits. The NMOS transistors 210H and 210I operating as substantially short circuits couples the node 235 to VSS (e.g., a ground voltage potential), thereby resulting in a binary "0" being present at node 235. Under the above configuration, when SEL is "1" and DI is "1", current flows from a supply voltage (VDD) through PMOS transistors 205A, 205C, and 205J to node 220 such that a voltage present at node 220 is substantially similar to VDD (minus any associated voltage drops) and is equivalent to a binary "1".

The PMOS transistor 205O and the NMOS transistor 210A together form an inverter configured to invert the value present at node 220 into an inverted value present at node 225, and as such invert the binary "1" present at node 220 to a binary "0" present at node 225. When the value present at node 220 is a binary "0", the NMOS transistor 210A operates as a substantially open circuit and the PMOS transistor 205O operates as a substantially short circuit, coupling node 225 to VDD. When the value present at node 220 is a binary "1", the NMOS transistor 210A operates as a substantially closed circuit coupling node 225 to VSS and the PMOS transistor 205O operates as a substantially open circuit. The value present at node 225 is the value output by the OTP circuit 110 as DOutBar_out.

The inverter formed by PMOS transistor 205O and the NMOS transistor 210A, along with PMOS transistor 205P, forms a voltage feedback loop. Additionally, DOutBar_out may be coupled, via an inverter, to a feedback input, indicated in FIGS. 2A and 2B as DOut_FB_in, such that a value of DOut_FB_in is an inverse of a value of DOutBar_out. Therefore, when SEL is "1" and DI is "1", DOutBar_out is "0" and DOut_FB_in is "1". When DOut_FB_in is "1", NMOS transistor 210K operates as a substantially short circuit that couples the drain of the OTP memory 215 to the drain of the NMOS transistor 210L. When the value present at node 225 is a binary "0", the PMOS transistor 205P couples node 230 to VDD to provide a redundant path to VDD for node 220 when SEL is "1" and DI is "1". A remainder of the transistors in the OTP circuit 110 not explicitly discussed above may be considered to be operating as substantially open circuits when SEL is "1" and DI is "1".

When SEL is "1" and DI is "0", the OTP circuit 110 outputs DIB (e.g., "1") as DOutBar_out. When SEL is "1", DI is "0", and VB is "0", PMOS transistors 205B, 205C, 205D, 205F, 205G, and 205H operate as substantially short circuits while PMOS transistors 205A, 205J, and 205P operate as substantially open circuits. Similarly, NMOS transistors, 210F, and 210H operate as substantially open circuits and NMOS transistors 210B, 210C, 210E, and 210I operate as substantially short circuits. The NMOS transistors 210B and 210C operating as substantially short circuits couples the node 220 to VSS (e.g., a ground voltage potential) resulting in a binary "0" being present at node 220. Under the above configuration, when SEL is "1" and DI is "0", node 220 is tied directly to VSS such that a voltage present at node 220 is substantially similar to VSS and is equivalent to a binary "0". Additionally, under the above configuration, when SEL is "1" and DI is "0", current flows from VDD through PMOS transistors 205F and 205G to node 235, to which the gate terminal of NMOS transistor 210E is coupled. The value present at node 235 controls NMOS transistor 210E to operate as a substantially short circuit, thereby creating a redundant path to VSS for node 220 when SEL is "1" and DI is "0". The inverter formed by PMOS transistor 205O and the NMOS transistor 210A inverts the value present at node 220 into the inverted value present at node 225, and as such inverts the binary "0" present at node 220 to a binary "1" present at node 225.

PMOS transistor 205I and the NMOS transistor 210J together form an inverter, that along with PMOS transistor 205H, forms a voltage feedback loop. When the value present at node 235 is a binary "1", the PMOS transistor 205H couples node 240 to VDD to provide a redundant path to VDD for node 235 when SEL is "1" and DI is "0". During testing, a program signal, indicated in FIGS. 2A and 2B as PROG, may have a value of "0", thereby causing the PMOS transistor 205L to operate as a substantially short circuit. Additionally, the PMOS transistors 205K and 205N are configured in a diode configuration (e.g., with a gate terminal and a drain terminal shorted together for each respective transistor) to protect the OTP memory 215 during testing. Similarly, when SEL is "1" and DI is "0", the PMOS transistor 205M may operate as a substantially short circuit, thereby preventing the drain of the OTP memory 215 from being pulled to ground and inadvertently or accidentally programming the OTP memory 215 prior. A remainder of the transistors in the OTP circuit 110 not explicitly discussed above may be considered to be operating as substantially open circuits when SEL is "1" and DI is "0".

After testing, the controller 140 may choose to program the OTP memory 215 with a binary "1" (electing not to program the OTP memory with a binary "1" may be referred to as programming the OTP memory 215 with a binary "0"). To program, or burn, the OTP memory 215 with a binary "1", the controller 140 transmits PROG to the OTP circuit 110. When PROG is "1", the NMOS transistor 210L operates as a substantially short circuit. Because DI is "1", the NMOS transistor 210K is also operating as a substantially short circuit as discussed above, thereby coupling the drain of the OTP memory 215 to VSS. Additionally, the PMOS transistor 205K may operate as a substantially short circuit, the PMOS transistors 205L, and 205M may operate as substantially open circuits, and the PMOS transistor 205N remains configured in the diode configuration and operates as a substantially open circuit. Substantially simultaneously with transmitting the program signal to the OTP memory 110, the controller 140 instructs the power supply (not shown) to increase a voltage supplied to the OTP circuit 110 to a sufficiently high value to cause DI (e.g., binary "1") to be burned to the gate of the OTP memory 215, as discussed above. In some embodiments, a normal operating voltage of the OTP circuit 110 may be about 3.3 volts and a voltage that causes the binary "1" to be burned to the gate of the OTP memory 215 may be about 7 volts. The voltage that causes the binary "1" to be burned to the gate of the OTP memory 215 may be maintained by the power supply for a predetermined amount of time, or until the power supply is instructed by the controller 140 to cease providing the voltage that causes the binary "1" to be burned to the gate of the OTP memory 215 to the OTP circuit 110. For example, in some embodiments, the voltage that causes the binary "1" to be burned to the gate of the OTP memory 215 may be provided to the OTP circuit 110 for about 300 microseconds.

After burning the binary "1" to the gate of the OTP memory 215, the controller 140 may instruct the power supply to momentarily cease providing power to the OTP circuit 110, thereby resetting the OTP circuit 110 and clearing the volatile memory portion of the OTP circuit 110. Subsequently, the controller 140 transmits a precharge signal, indicated in FIGS. 2A and 2B as PCHG, to the OTP circuit 110 to precharge the OTP circuit 110. When PCHG is "1", the NMOS transistors 210D and 210G operate as substantially short circuits, coupling the nodes 220 and 235, respectively, to VSS.

After the OTP memory 215 is programmed, when the OTP memory is programmed with a binary "0" (e.g., by leaving the gate terminal of the OTP memory 215 floating and not burning a binary "1" onto the gate terminal) and VB is "0", the PMOS transistors 205F, 205G, and 205H operate as substantially short circuits, coupling the node 235, and thereby the gate terminal of NMOS transistor 210E, to VDD. The value present at node 235 controls NMOS transistor 210E to operate as a substantially short circuit, thereby creating a path to VSS for node 220. The inverter formed by PMOS transistor 205O and the NMOS transistor 210A inverts the value present at node 220 into the inverted value present at node 225, and as such inverts the binary "0" present at node 220 to a binary "1" present at node 225 for output as DOutBar_out. When the OTP memory is programmed by burning a binary "1" onto the gate terminal of the OTP memory 215 and VB is "0", the OTP memory 215 and PMOS transistors 205E, 205J, and 205P operate as substantially short circuits, coupling the node 220 to VDD. The inverter formed by PMOS transistor 205O and the NMOS transistor 210A inverts the value present at node 220 into the inverted value present at node 225, and as such inverts the binary "1" present at node 220 to a binary "0" present at node 225 for output as DOutBar_out.

FIG. 3 is a signal diagram of the OTP circuit 110 in accordance with various embodiments. FIG. 3 illustrates a sequence of signals received by the OTP circuit 110 from the controller 140, or output by the OTP circuit 110 to the test circuit 120, during volatile testing output of the OTP circuit 110, programming of the OTP circuit 110 with a binary "1", and non-volatile output of the OTP circuit 110. When the OTP circuit 110 is first turned on, the OTP circuit 110 may receive a power supply of about 3.3 volts, as illustrated by line 310. Also as shown in FIG. 3, when the OTP circuit 110 receives a power supply of 3.3 volts, a binary or logical "1" may represent a signal of about 3.3 volts and a binary or logical "0" may represent a signal of about 0 volts. As illustrated by lines 320 and 330, when the controller 140 wishes to test a value, the controller 140 sets SEL to "1" and DI to "1", thereby causing an output of the OTP circuit 110 to also be "1", as shown by line 360.

When DI is "1" and the controller 140 wishes to program the OTP circuit 110 with the value of DI, the controller 140 sets SEL to "0", PROG to "1", and instructs a power supply that is supplying power to the OTP circuit 110 to provide the OTP circuit with an increased voltage, in some embodiments, 7 volts, as shown by lines 350 and 310, respectively. The OTP circuit 110 may continue receiving the increased voltage for as long as the controller sets PROG to "1", for example, for a period of time exceeding a threshold for programming a binary "1" to the OTP circuit 110. After the OTP circuit 110 is programmed, the controller sets PROG to "0" and instructs the power supply to momentarily provide no power to the OTP circuit 110 prior to returning to providing the previous 3.3 volts, as shown by lines 350 and 310, respectively. The controller 140 further sets PCHG to "1" momentarily to precharge the OTP circuit 110 by coupling a cross-coupled latch of the OTP circuit 110 to VSS, as shown by line 340. After precharging, the output of the OTP circuit 110 settles to the value programmed to the OTP circuit 110, or in the case of FIG. 1, a value of "1", as shown by line 360.

Figure 4:
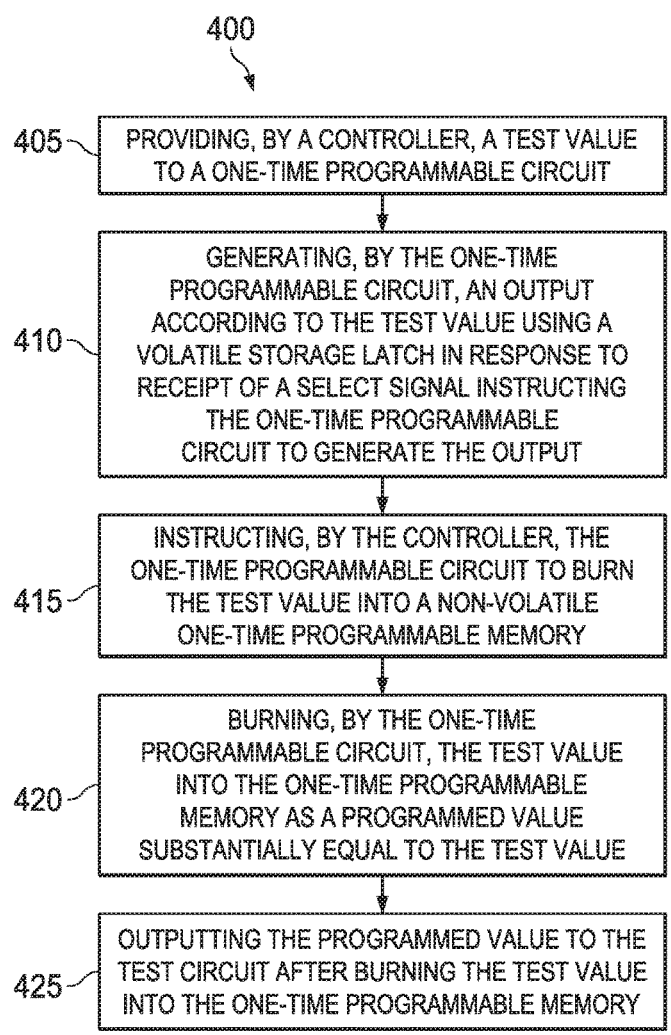
FIG. 4 shows a flowchart of a method for programming the OTP circuit in accordance with various embodiments.

FIG. 4 is a method for programming the OTP circuit 110, in accordance with various embodiments. The method is implemented by a test system, such as the testing system 100, for programming the OTP circuit 110. For example, the programming is performed, in some embodiments, after testing a value which is to be programmed to the OTP circuit to determine if the value is a correct or desired value and/or results in a desired response in a device coupled, directly or indirectly, to the OTP circuit 110.

At operation 405, a test value is provided to the OTP circuit 110. The test value is provided by a controller, such as the controller 140 of FIG. 1. The controller may be any suitable logic structure capable of receiving input and generating output according to the received input and/or pre-programmed instructions.

At operation 410, the OTP circuit 110 generates an output according to the test value using a volatile storage latch in response to receipt of a select signal instructing the OTP circuit 110 to generate the output. The output is provided, for example, to a test circuit such as the test circuit 120 of FIG. 1, to determine whether the test value should be programmed to the OTP circuit 110.

At operation 415, the controller instructs the OTP circuit 110 to burn the test value into non-volatile OTP memory 215 of the OTP circuit 110. The controller instructs the OTP circuit 110 to burn the test value into the non-volatile OTP memory 215 by transmitting to the OTP circuit 110 a program signal.

At operation 420, the OTP circuit 110 burns the test value into the OTP memory 215 as a programmed value substantially equal to the test value. The test value is burned into the OTP memory 215, for example, by asserting a sufficiently high voltage across a drain and a source of the OTP memory 215 for a period of time sufficient to cause a floating gate of the OTP memory 215 to charge to a binary "1". At operation 425, the OTP circuit 110 outputs the programmed value to the test circuit.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other intervening devices and/or connections. Unless otherwise stated, "about", "approximately", or "substantially" preceding a value means+/−10 percent of the stated value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A one-time programmable (OTP) circuit, comprising:
a non-volatile OTP memory disposed on a first circuit die and comprising a floating gate terminal;
a cross-coupled latch disposed on the first circuit die and coupled to the non-volatile OTP memory; and
volatile memory input circuitry disposed on the first circuit die and coupled to the cross-coupled latch, the volatile memory input circuitry being configured to receive a test value and to write the test value into the cross-coupled latch;
wherein the OTP circuit is configured to receive a programming command and to store the test value in the non-volatile OTP memory in response to receiving the programming command.

2. The OTP circuit of claim 1, wherein the volatile memory input circuitry is coupled to the cross-coupled latch in parallel with the non-volatile OTP memory.

3. The OTP circuit of claim 1, further comprising an inverter coupled to the cross-coupled latch, wherein an output of the cross-coupled latch is inverted by the inverter to form an OTP circuit output.

4. The OTP circuit of claim 1, wherein the non-volatile OTP memory comprises a p-type metal oxide semiconductor (PMOS) transistor.

5. The OTP circuit of claim 1, wherein the cross-coupled latch comprises a first path and a second path, wherein the non-volatile OTP memory is disposed in the first path, and wherein the volatile memory input circuitry is coupled to the first path and the second path.

6. The OTP circuit of claim 5, wherein:
the first path of the cross-coupled latch comprises:
a first p-type metal oxide semiconductor (PMOS) transistor; and
a first n-type metal oxide semiconductor (NMOS) transistor coupled between the first PMOS transistor and a ground potential, wherein the first PMOS transistor is coupled between the volatile memory input circuitry and the first NMOS transistor; and
the second path of the cross-coupled latch comprises:
a second PMOS transistor; and
a second NMOS transistor coupled between the second PMOS transistor and the ground potential, and wherein the second PMOS transistor is coupled between the volatile memory input circuitry and the second NMOS transistor.

7. The OTP circuit of claim 5, wherein the volatile memory input circuitry comprises:
a third NMOS transistor configured to receive an inverse of the test value; and
a fourth NMOS transistor configured to receive a select value and coupled between the third NMOS transistor and a ground potential, and wherein the third NMOS transistor is coupled between the first path of the cross-coupled latch and the fourth NMOS transistor.

8. The OTP circuit of claim 7, wherein the volatile memory input circuitry further comprises:
a third PMOS transistor configured to receive the inverse of the test value; and
a fourth PMOS transistor configured to receive an inverse of the select value and coupled between the third PMOS transistor and the first path of the cross-coupled latch, and wherein the third PMOS transistor is coupled between a voltage source and the fourth PMOS transistor.

9. A test system, comprising:
a one-time programmable (OTP) circuit;
a test circuit coupled to the OTP circuit;
a measurement device coupled to the test circuit; and
a controller coupled to the OTP circuit and the measurement device and configured to transmit a test value to the OTP circuit for use in testing the test circuit, receive a measurement from the measurement device, wherein the measurement indicates a response of the test circuit generated responsive to receipt of the test value from the OTP circuit, and program the OTP circuit with the test value responsive to receipt of the measurement from the measurement device.

10. The test system of claim 9, wherein the OTP circuit comprises a non-volatile OTP memory and a volatile memory on a same electrical chip die.

11. The test system of claim 9, wherein the OTP circuit comprises:
a non-volatile OTP memory disposed on a first circuit die comprising a floating gate terminal;
a cross-coupled latch disposed on the first circuit die and coupled to the non-volatile OTP memory; and
volatile memory input circuitry disposed on the first circuit die and coupled to the cross-coupled latch in parallel with the non-volatile OTP memory.

12. The test system of claim 11, wherein an output of the cross-coupled latch is coupled to an output of the non-volatile OTP memory and an output of the volatile memory.

13. The test system of claim 12, further comprising an inverter coupled to the output of the cross-coupled latch, wherein the output of the cross-coupled latch is inverted by the inverter to form an OTP circuit output.

14. The test system of claim 13, wherein the OTP circuit output is transmitted by the OTP circuit to the test circuit.

15. The test system of claim 11, wherein the non-volatile OTP memory comprises a p-type metal oxide semiconductor (PMOS) transistor.

16. A method, comprising:
providing, by a controller, a test value to a one-time programmable (OTP) circuit;

generating, by the OTP circuit, an output according to the test value using a volatile storage latch in response to receipt of a select signal instructing the OTP circuit to generate the output;

instructing, by the controller, the OTP circuit to burn the test value into a non-volatile OTP memory; and burning, by the OTP circuit, the test value into the non-volatile OTP memory as a programmed value substantially equal to the test value.

17. The method of claim 16, further comprising outputting, by the OTP circuit, the programmed value to the test circuit after burning the test value into the non-volatile OTP memory.

18. The method of claim 16, wherein the volatile storage latch and the non-volatile OTP memory are on a common electrical component die.

19. The method of claim 16, wherein the non-volatile OTP memory is coupled in parallel with the volatile storage latch to an output of the OTP circuit.

20. The method of claim 16, wherein the non-volatile OTP memory comprises a floating gate terminal, and wherein burning the test value into the non-volatile OTP memory comprises coupling the non-volatile OTP memory between a voltage source configured to charge the floating gate terminal and a ground potential.

\* \* \* \* \*